US009300262B2

(12) United States Patent
Trammell (10) Patent No.: US 9,300,262 B2
(45) Date of Patent: Mar. 29, 2016

(54) AUDIO PROCESSING APPLICATION FOR WINDOWS

(71) Applicant: Lloyd Trammell, Thousand Oaks, CA (US)

(72) Inventor: Lloyd Trammell, Thousand Oaks, CA (US)

(73) Assignee: Adli Law Group P.C., Los Angeles, CA (US)

( * ) Notice: Subject to any disclaimer, the term of this patent is extended or adjusted under 35 U.S.C. 154(b) by 18 days.

(21) Appl. No.: 14/272,379

(22) Filed: May 7, 2014

(65) Prior Publication Data
US 2015/0326195 A1    Nov. 12, 2015

(51) Int. Cl.
*H03G 3/00* (2006.01)
*H03G 3/20* (2006.01)
*G10L 19/26* (2013.01)

(52) U.S. Cl.
CPC  *H03G 3/00* (2013.01); *G10L 19/26* (2013.01); *H03G 3/20* (2013.01)

(58) Field of Classification Search
None
See application file for complete search history.

(56) References Cited

U.S. PATENT DOCUMENTS

2010/0329466 A1*  12/2010  Berge .............................. 381/22

* cited by examiner

*Primary Examiner* — Andrew L Sniezek
(74) *Attorney, Agent, or Firm* — Adli Law Group P.C.

(57) ABSTRACT

An audio enhancement technique comprises an audio source. The audio source is split into at least two branches and each of the branches is processed by a filter bank. Outputs from the filer banks are summed up to create a summed output signal. The summed output signal is splitting into two or more segments to create a split summed output signal. The split summed output signal is processed by one or more audio processing modules. Audio processed by each of the audio processing modules is summed to create a summed audio processed signal. The summed audio processed signal is provided to a balance module to select a balance mix of the audio source and the summed audio processed signal to create a balanced mixed audio signal. The balanced mixed audio signal is fed to a stereo output gain module for gain adjustment to create a gain adjusted stereo signal. The phase of the gain adjusted stereo signal is optionally changed in an amount between zero and 180 degrees to create a final output signal, which is sent to a playback device selected by user.

5 Claims, 12 Drawing Sheets

AUDIO PROCESSING APPLICATION FOR WINDOWS

BACKGROUND OF THE INVENTION

In today's world of audio, there is a necessity to compress audio in some fashion in order to save space or size because of the limitations of broadcast and the internet. One of the caveats for accomplishing this goal is the formation and overall acceptance of compressed audio formats such as MP3, AAC, MP4, etc.[1]

[1] http://en.wikipedia.org/wiki/MP3;
http://www.keithstead.com/and_more/cd_vs_mp3.html;
http://en.wikipedia.org/wiki/Advanced_Audio_Coding;
http://en.wikipedia.org/wiki/IPv4_address_exhaustion;
http://www.deloitte.com/view/en_AU/au/industries/tmt/tmt-predictions-2013/
db455c075207c310VgnVCM3000003456f70aRCRD;
htmhttp://penngood.com/wp-content/uploads/2014/03/nielsen-cross-platform-report-march-2014.pdf;
http://en.wikipedia.org/wiki/High-definition_video The vast majority of conventional digital audio is MP3. While these formats do indeed decrease the file size by large amounts, the audio quality does suffer in both harmonic and dynamic range properties. There is no true totally "lossless" form of digital audio compression. Even the ones that claim to be "lossless" still have artifacts and the file size is very large compared to a normal MP3 file. There are download services and streaming sources that are compressed MP3 format and are commonly found on the internet. MP3 is the world standard audio compression format at this time.

As more of these content sources become available to the public, the available space lessens. There is a finite amount of space for the internet and for broadcast spectrum. They are both experiencing issues with available space at this time, and there appears to be no solution other than more compression of some type. As the HD video becomes more prevalent, users have accepted the fact that the audio will be compromised in quality for consumption. In an effort to help correct this audio problem, the inventive MAX SOUND resynthesis method to resynthesizes both harmonic and dynamic content back into the audio without increasing the file size, or change its format.

There are many tools that claim to "enhance" audio, but they are a stale and static type of process that can only affect the audio much in the same way as a simple tone control does. The inventive MAX SOUND process is an extremely dynamic process that can repair the anomalies created by a compression format, such as MP3, and add the harmonic and dynamic content back into the file while giving the end user some control of the tonality at the same time. One analogy for comparison would be the difference between looking at a picture (everyone else) of something, or watching a movie MAX SOUND) of the same thing. The MAX SOUND process is continually changing how and where it is working dependent upon the source material is being processed.

A new method and process is therefor required that addresses the above noted deficiencies of the conventional methods.

SUMMARY OF THE INVENTION

An audio enhancement technique comprises an audio source. The audio source is split into at least two branches and each of the branches is processed by a filter bank. Outputs from the filer banks are summed up to create a summed output signal. The summed output signal is splitting into two or more segments to create a split summed output signal. The split summed output signal is processed by one or more audio processing modules detailed further herein. Audio processed by each of the audio processing modules is summed to create a summed audio processed signal. The summed audio processed signal is provided to a balance module to select a balance mix of the audio source and the summed audio processed signal to create a balanced mixed audio signal. The balanced mixed audio signal is fed to a stereo output gain module for gain adjustment to create a gain adjusted stereo signal. The phase of the gain adjusted stereo signal is optionally changed in an amount between zero and 180 degrees to create a final output signal, which is sent to a playback device selected by user.

MAX SOUND process is considered to be "HD AUDIO." While there is no one universally accepted definition for HD Audio, we will offer that the definition must be similar to HD Video. That definition states, "High-definition video is video of higher resolution than is standard-definition" according to Wikipedia. With that in mind, for any audio to be considered HD it must be of a higher resolution (have more content) the standard version. The MAX SOUND process is a resynthesis technique that does indeed give the user a file with more dynamic, phase relationship, and harmonic content to an audio file thus qualifying it as "HD AUDIO." The file size will not change unless the user converts it to a different one, yet the content is harmonically richer and more dynamic than it was before. This is not simple EQ, it is resynthesis.

The MAX SOUND process resynthesizes audio content to add back missing harmonic, phase, and dynamic ranges that might have been depleted or otherwise damaged in the recording or compression (data or audio compression) of the content. Using the MAX SOUND process increases the user experience by correcting anomalies caused by compression and making the audio much more clear and robust. Much like listening to a speaker with a moving blanket covering it and then removing it for a better sound experience.

In one embodiment, an audio source (analog or digital) is selected as a file, or from a "live real-time input. This audio enters the MAX SOUND process and can be a stereo, 5.1, 3.1, 7.1, etc. In one embodiment, this source is split into four identical braches to be processed by four individual Filter Banks. The Filter Banks are preferably dynamic in nature and change what they are doing both harmonically and dynamically as the audio passes through each Filter Bank. In one embodiment, the number of filter banks is four and the output of all four Filter Banks are summed together to be fed into the next section. This output is preferably split into six identical branches that feed each of the modules in the next section. Each of these modules function independently of each other and their outputs are summed together to feed a wet/dry mixer. This allows the users to set the blend of the original and affected audio. The user now has the capability to change the phase of this output by 180 degrees, independently or separately. This output has a bypass for selecting the affected mix audio or the original only audio for comparison. This final output goes into whatever playback device the user has selected in the Audio Out menu.

DETAILED DESCRIPTION OF THE PREFERRED EMBODIMENT(S)

Details of the present invention will now be discussed by reference to the drawings.

Figure 1:
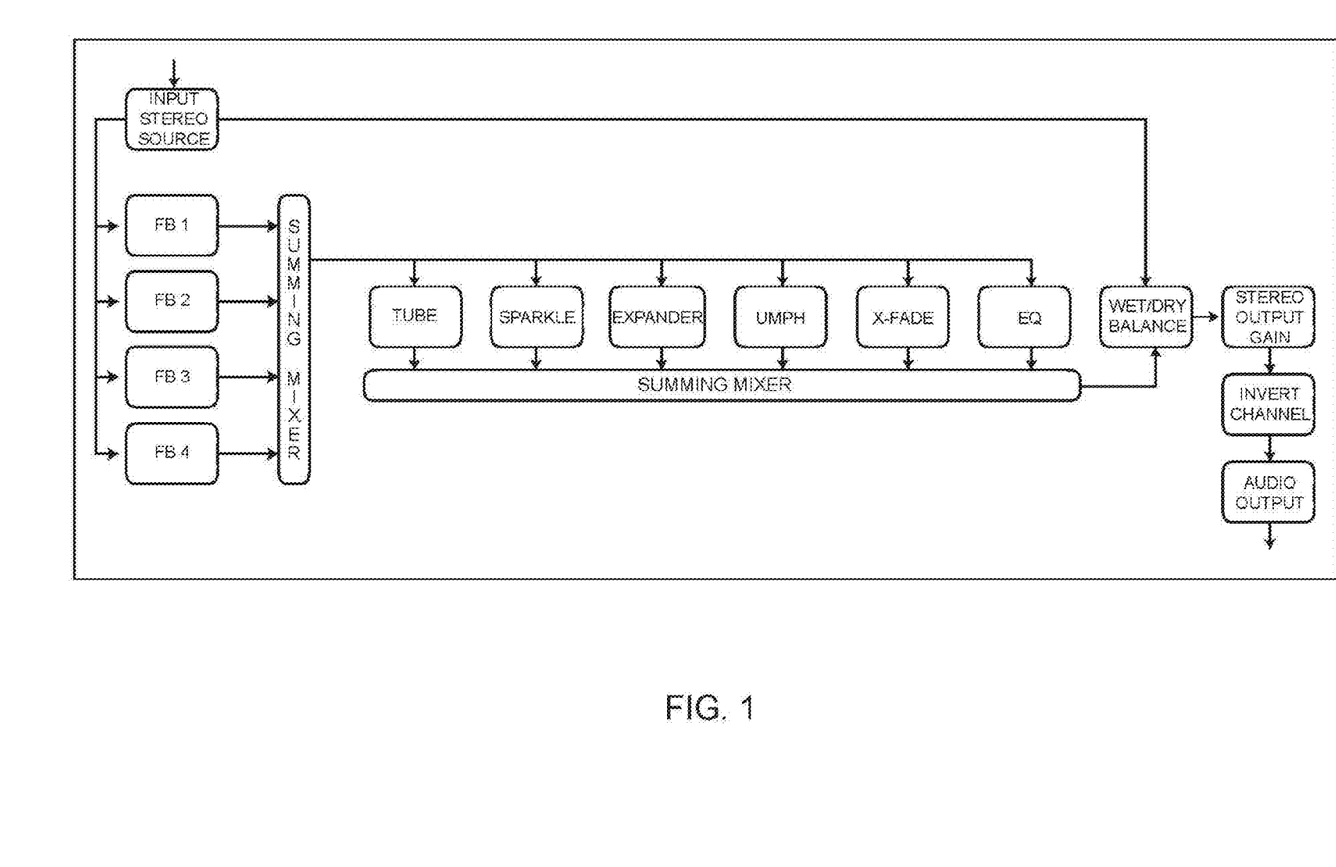
FIG. 1 represents the signal flow path for the entire MAX SOUND process according to an exemplary embodiment of the present invention. All of the user editable modules are shown here as well as the summing mixers which are not.
Figure 2:
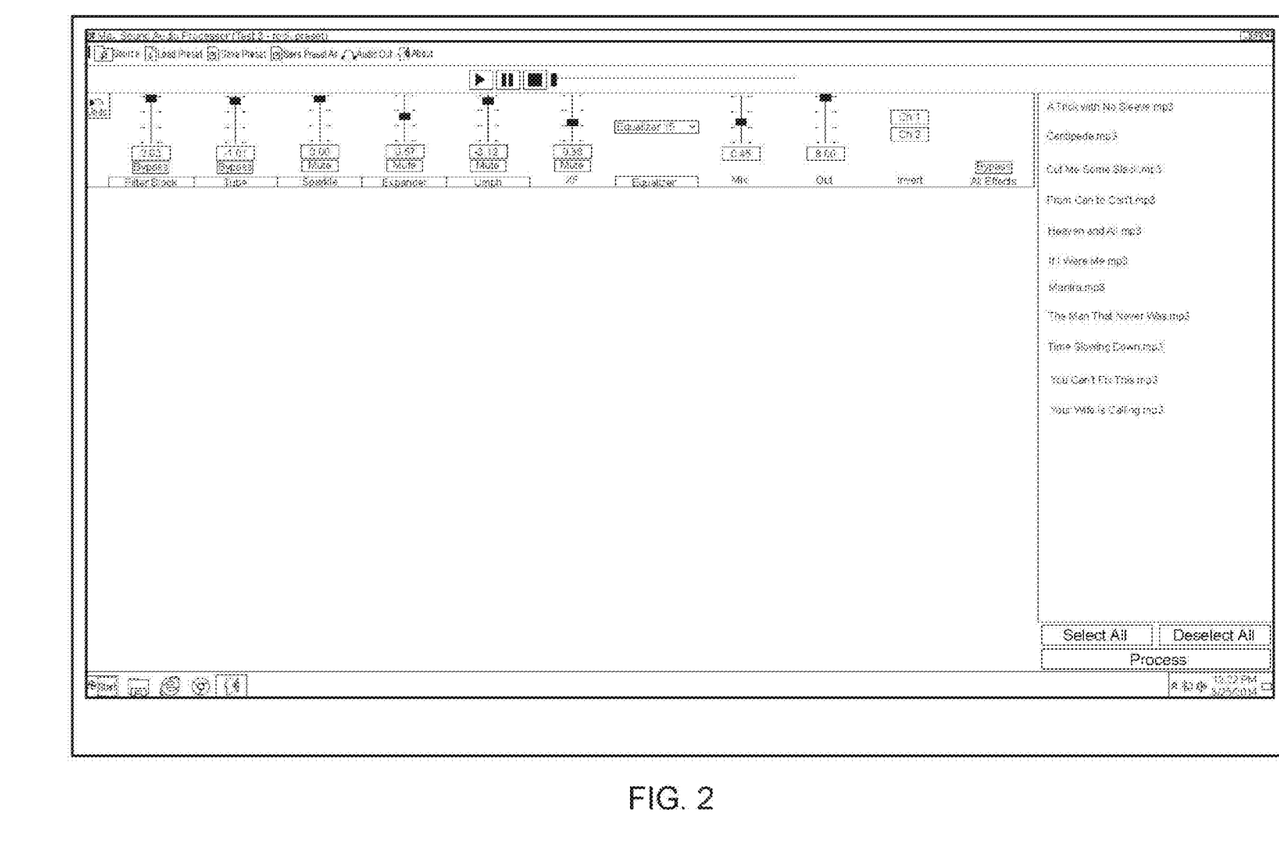
FIG. 2 shows the opening page for the program according to an exemplary embodiment of the present invention.

FIG. 1 represents the signal flow path of a audio processing according to an exemplary embodiment of the present invention. All of the user editable modules are shown here as well as the summing mixers which are not. FIG. 2 depicts the main page from where a user will work, or edit selected audio. On this page user can select modules and edit them as well as control the total overall or master amount for that module. The selection and playback controls are available on this page as well. The user can use the bypass buttons to turn off or compare different modules and their affect on the selected audio. A final bypass is for comparison of processed versus unprocessed audio. Each module will be described in greater detail further in this document.

Figure 3:
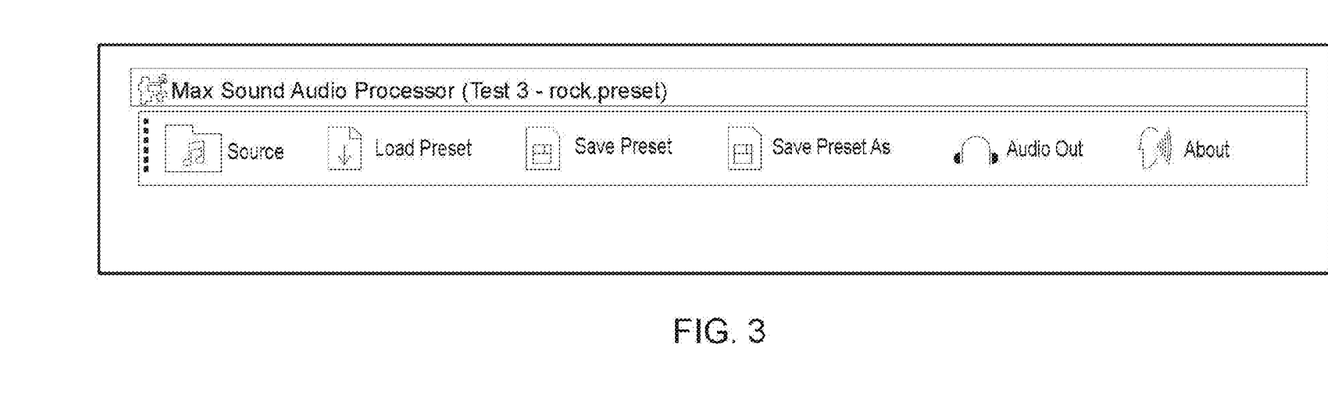
FIG. 3 shows an exemplary illustration of the file management according to an embodiment of the present invention.
Figure 7A:
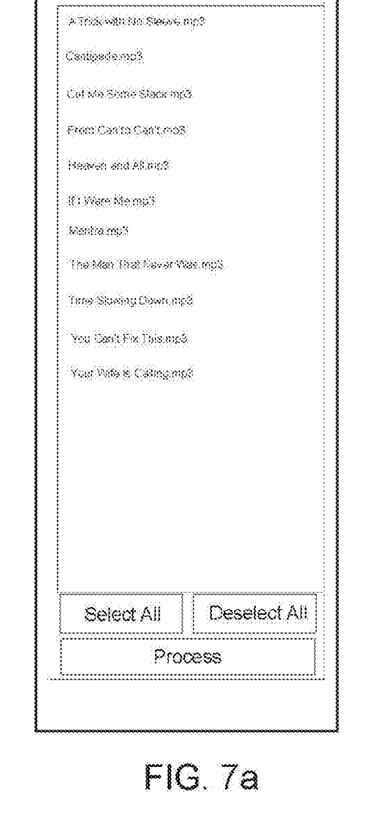
FIGS. 7a to 7d respectively show the "Track Selection," the "Save File Type," the "Playback Rate," and the "Processing Status" menus according to an exemplary embodiment of the present invention.
Figure 7B:
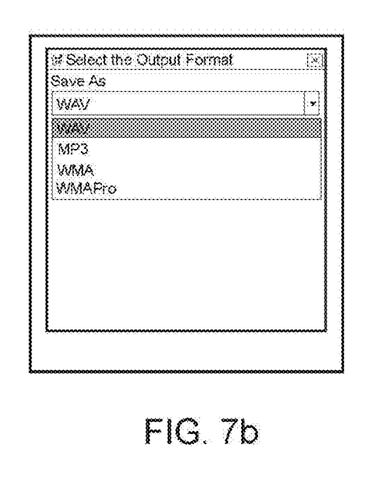
Figure 7C:
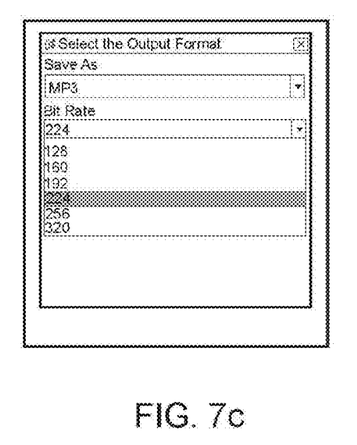
Figure 7D:
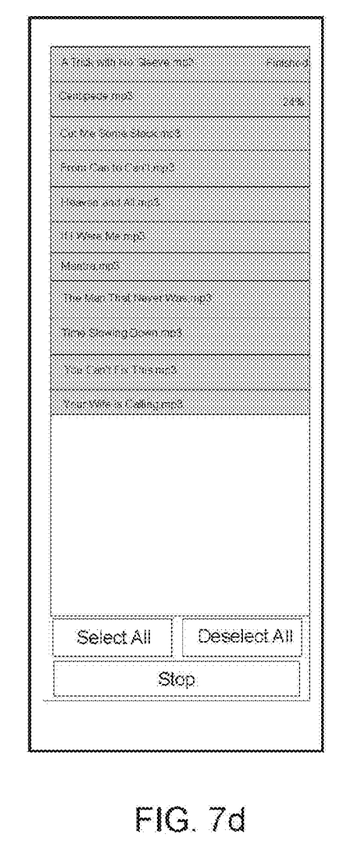

FIG. 3 shows the file management controls according to an exemplary embodiment of the present invention. The File Management Controls shown are as follows: 1. Source—locates the material to be loaded in the MAX SOUND process for processing; A). Browse File—search for files on your computer system; B). Recent Files—shows recently used files; C). Browse Folder—search for folders on your computer system; D.) Recent Folder—shows recently used folders. 2. Load Preset—load an existing preset, shows a list of existing presets wherever they are saved. 3. Save Preset—name and save a preset of all values in the MAX SOUND PROCESS to a location. 4. Save Preset As—allows users to rename and save a loaded preset (maybe a new version of an existing preset) to a location. 5. Audio Out—user selects which output for monitoring. 6. About—information about this program and finished indicator for that particular piece. If you right click on a title in FIG. 7d, a "remove" option appears to delete or remove that selection.

Figure 4:
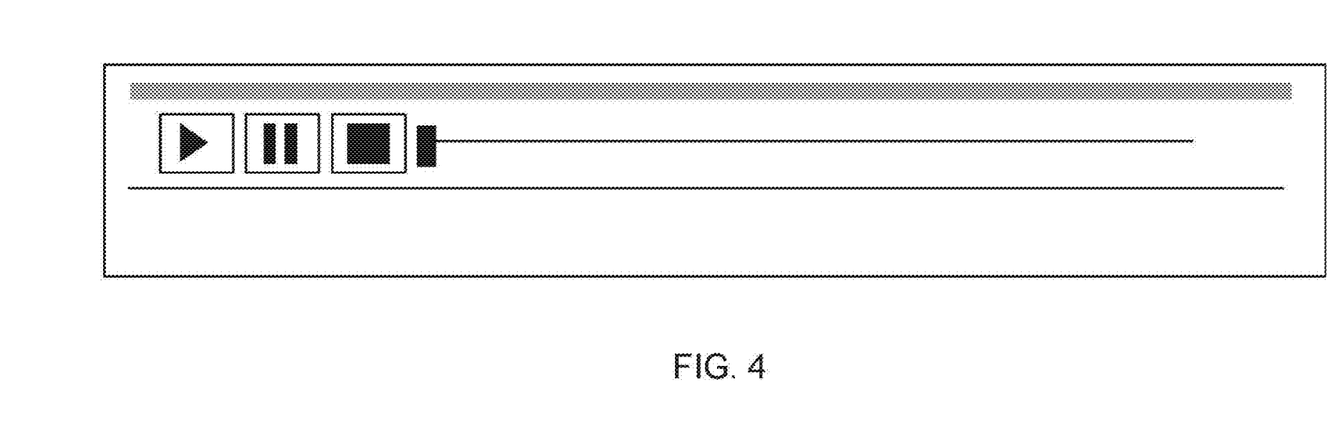
FIG. 4 shows a block diagram showing the signal flow according to an exemplary embodiment of the present invention.

FIG. 4 shows the Transport Controls, which, in this example, are Play, Pause, and Stop. The bar indicates the playback position in the audio and allows the user to move anywhere in the song. PLAY—starts playing the selected track; PAUSE—pauses playing the selected track and STOP—stops playing the selected track. STATUS BAR—indicates the position in the selected material that is currently playing. This can also be used to move to a chosen place in the selected track for playback.

Figure 5:
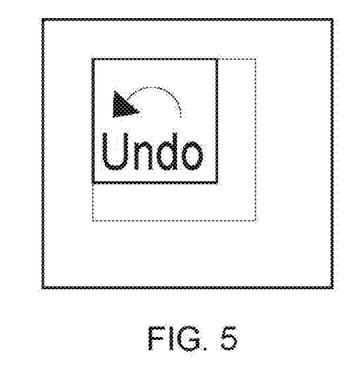
FIG. 5 shows the Undo control according to an exemplary embodiment of the present invention.

Per FIG. 5, there are an unlimited number of "Undo" that are saved with each preset. Meaning that even if user loads a new preset, the "Undo" levels are still there for the user.

Figure 6:
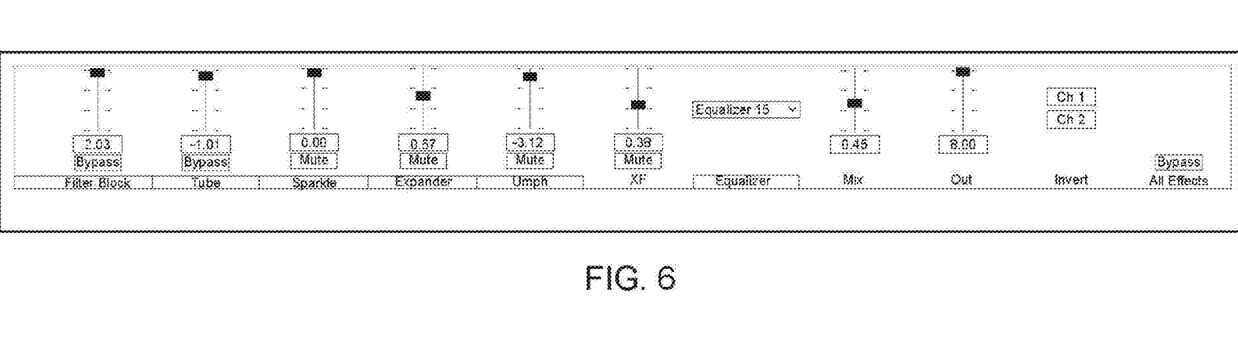
FIG. 6 shows the Master Processing Controls according to an exemplary embodiment of the present invention.

FIG. 6 shows the modules available in the MAX SOUND Process for editing. As one skilled in the art would appreciate, most of the modules can be "Bypassed" or Muted to remove them from the signal path and most have an adjustable "master" control for the total amount or level of a particular block or module. Each block or module will be explained in detail later in this document. The "Bypass" on the far right is for all effects or modules. This allows for quick comparison of processed vs. non-processed audio.

FIGS. 7a, 7b, 7c and 7d are explained as follows: After user loads some audio material into the MAX SOUND process, the names of this material will appear in the Track Selection area. User can load single or multiple tracks. User could load several singles into the Track Selection (7a) and choose to process them separately or all together as a batch. If user chooses only one piece of audio, only that one will be processed. When the process is told to "Process", a new window will appear so that you can select what type (7b) user wishes to save this material (WAV, MP3, WMA, WMA PRO) and the rate (7c), if applicable. Once the process has started, a stop button will appear in the place (7d) of the Process button so that the user can stop at any time. Also as each piece of audio is processed, there is a percentage.

Figure 8:
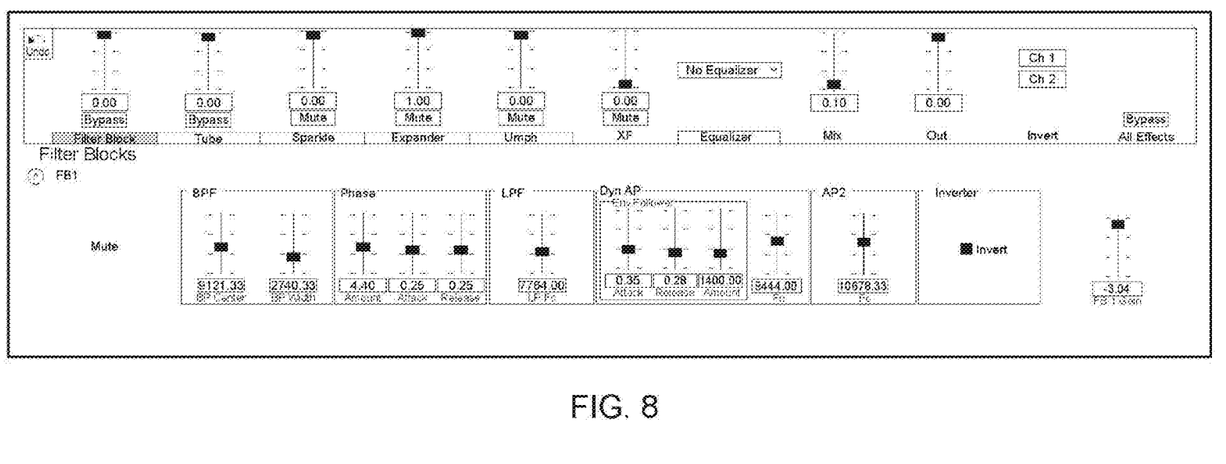
FIG. 8 shows the Filter Blocks according to an exemplary embodiment of the present invention.

FIG. 8 shows one of the Filter Blocks referenced and discussed above. Each of the filter blocks is identical, but can be set to operate in different areas as well as different dynamics. In one exemplary embodiment the controls are as follows: 1. Mute. 2. BPF (digital Band Pass Filter); 2A. BP Center—selects the harmonic content and center frequency for this filter; 2B. BP Width—selects the range of frequencies from the center out. For example if the center is 500 Hz and you have a width setting of 250 Hz, the entire range would be 250 Hz to 750 Hz. 3. Phase—effects the harmonic content and phase of the BPF dynamically; 3A. Amount—amount of phase shift will be applied to the audio; 3B. Attack—how fast the phase shift starts 3C. Release—the time allowed for the phase shift to complete and restart when a change is detected. 4. LPF (digital Low Pass Filter)—sets the upper limit of frequency content that is allowed to pass on to the next module in this Filter Block; 4A. LP FC—selects the upper frequency limit for this digital filter. 5. Dyn AP—dynamic digital All Pass Filter 1—Envelope Follower—follows the center frequency set by the FC control dynamically; 5A. Attack—how fast the envelope follower reacts to amplitude changes after the release time; 5B. Release—how much time before the envelope follower can restart; 5C. Amount—the total amount of phase shift (plus and minus) that is dynamically allowed to the audio passing through this section—FC—selects the center frequency for this filter. 6. AP2—digital All Pass Filter 2; 6A. FC—selects the center frequency for this filter. 7. Invert—flips the phase to a negative 180 degrees for the output of this entire filter block 8. FB # Gain—sets the final amplitude (master) for this entire filter block.

Figure 9:
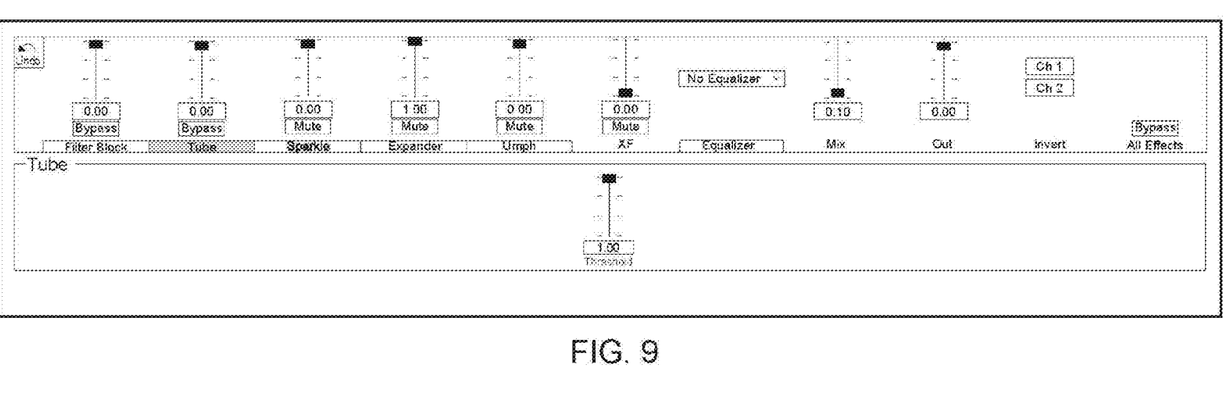
FIG. 9 shows the "Tube" control according to an exemplary embodiment of the present invention.

Figure Referring to FIG. 9, Tube module sets the amount of digitally simulated tube harmonics that are added into the audio path from the source. There is a Threshold adjustment control, which sets the initial level where the Tube will start processing and the level, or total amount of simulated tube sound is on the main page.

Figure 10:
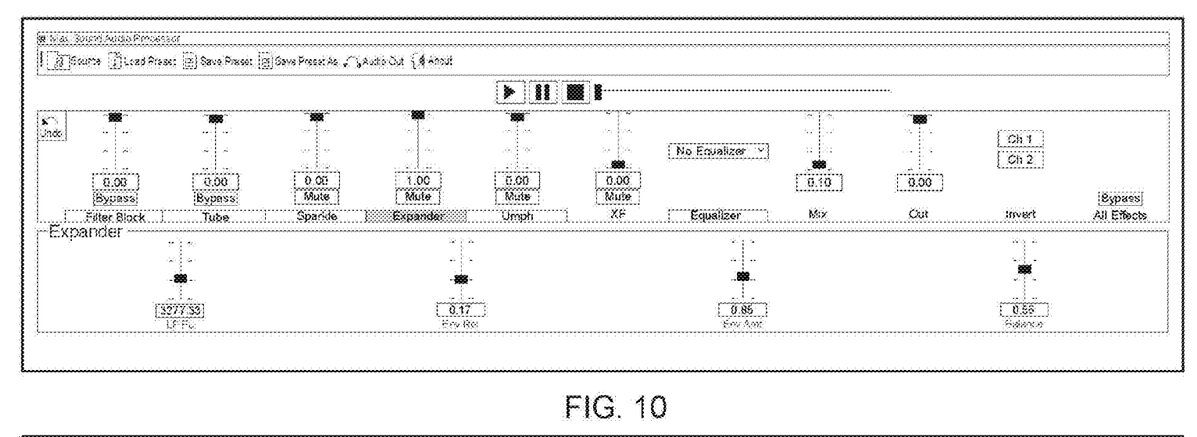
FIG. 10 shows the Expander module controls according to an embodiment of the present invention.

Referring to FIG. 10, Expander module is meant to dynamically add some user selected harmonic content back into the audio path. The controls for this module are as follows: 1. LP FC—digital Low Pass Filter center frequency. 2. Env Rel—envelope release time. 3. Env Amt—amount that the envelope will affect the audio passing through it. 4. Balance—a balance of the original audio that enters this module and the effected audio in the module for a blend of the two.

Figure 11:
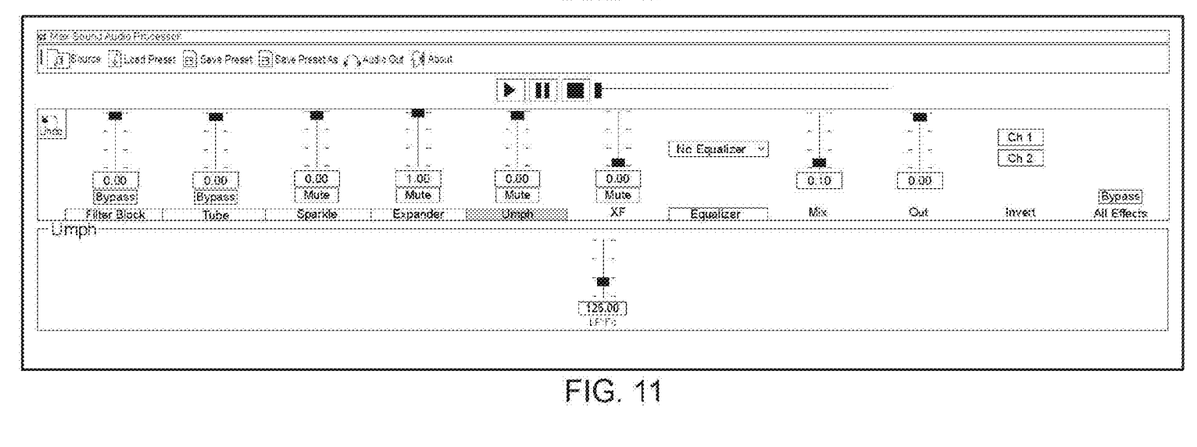
FIG. 11 shows the UMPH (Bass Enhancer) controls according to an exemplary embodiment of the present invention.

Referring to FIG. 11, the UMPH module adds more bass content to the audio passed through this module. There is an amount control for controlling the level of added bass and a control for setting the upper frequency limit of where this module can operate. The added bass is "sub octave" material that is generated by this section.

Figure 12A:
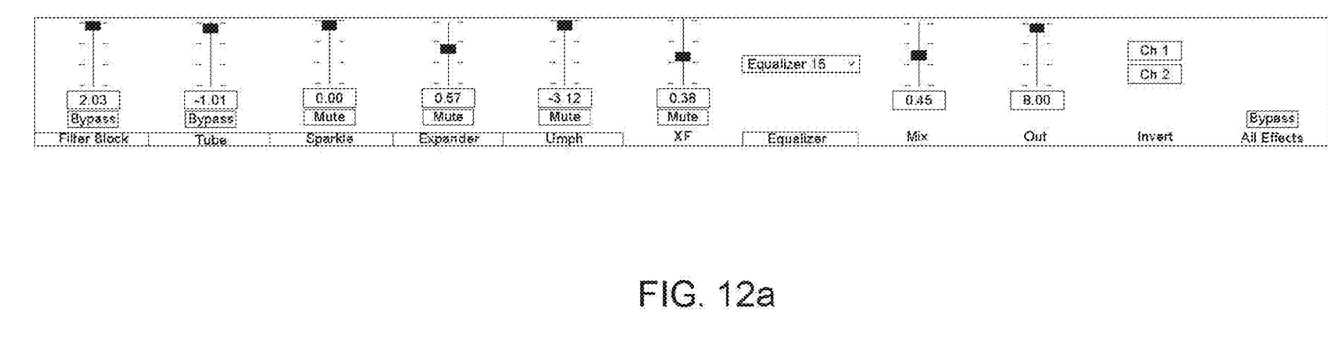
FIGS. 12a and 12b respectively show the XF (Crossfader) controls according to an embodiment of the present invention.
Figure 12B:
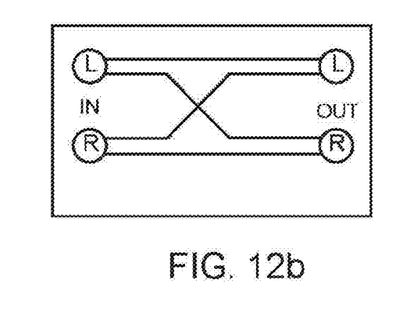

Referring to FIGS. 12a and 12b, FIG. 12a is the XF, or cross fader. This will route a small amount of audio from one side to the other. The amount (12b) of "left to right" and "right to left" are the same with the total amount set by the fader. There is a mute on this module for exclusion or comparison of the affect on the selected audio.

Figure 13:
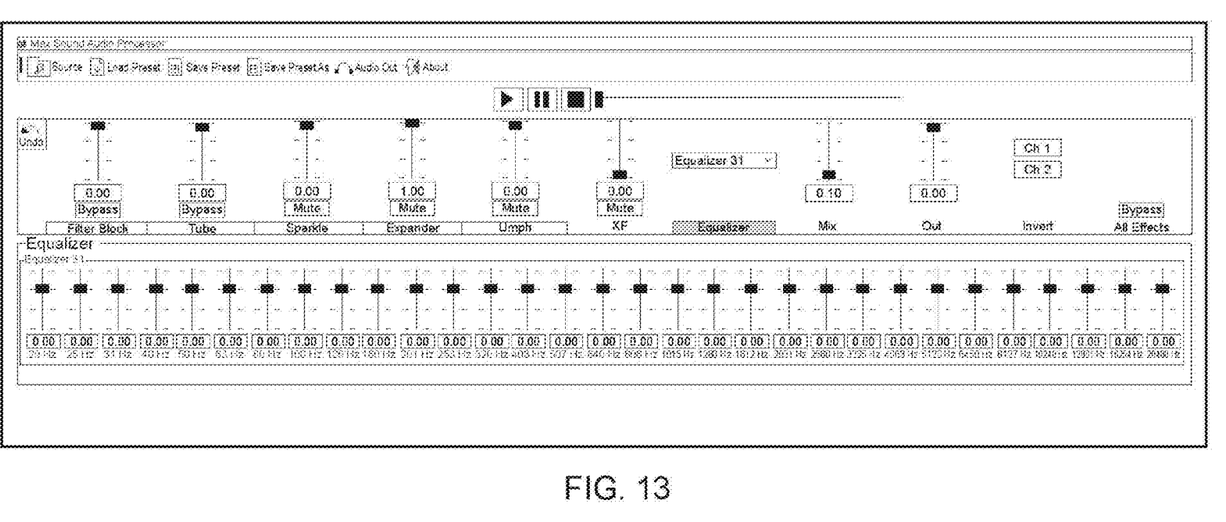
FIG. 13 shows the EQ (15 & 31 Band) controls according to an exemplary embodiment of the present invention.

Referring to FIG. 13, this section has three settings, No Equalizer, 15 Band, or 31 Band. The Equalizers are phase coherent and set to be ISO compliant centers. The Equalizers both have a range of −50 dB or +25 dB of adjustment per frequency center. A value of zero is null. There is also a "Reset" to set all bands in an Equalizer to zero.

Figure 14:
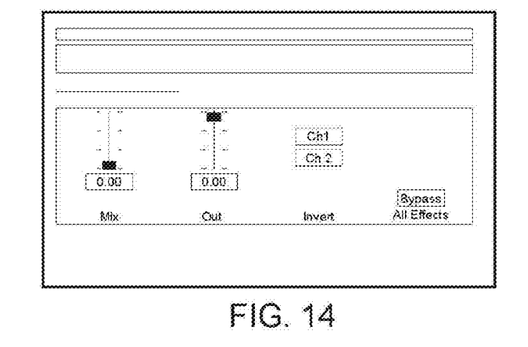
FIG. 14 shows the Mix/Out/Invert/Bypass controls according to an exemplary embodiment of the present invention.

Referring to FIG. 14, the output section consists of: 1. Mix—adjusts the balance between the effected and unaffected audio for a blend or mix of the two. 2. Out—sets the level of everything passing through the MAX SOUND process. 3. Invert—allows the user to change the phase of either, or both, outputs by 180 degrees. 4. Bypass—a global bypass for comparison of before and after processing an audio file, in real-time.

Figure 15A:
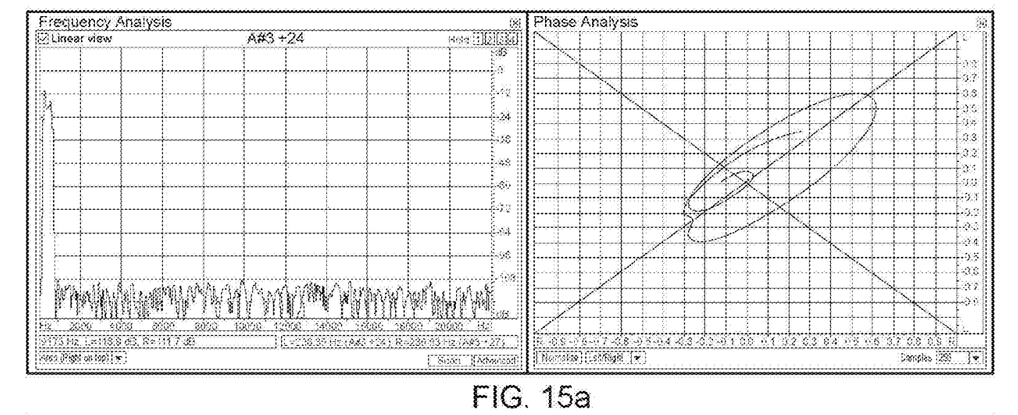
FIGS. 15a and 15b respectively show a single sample snapshot from a wave and a single sample snapshot of the same wave that has been processed, according to an exemplary embodiment of the present invention.
Figure 15B:
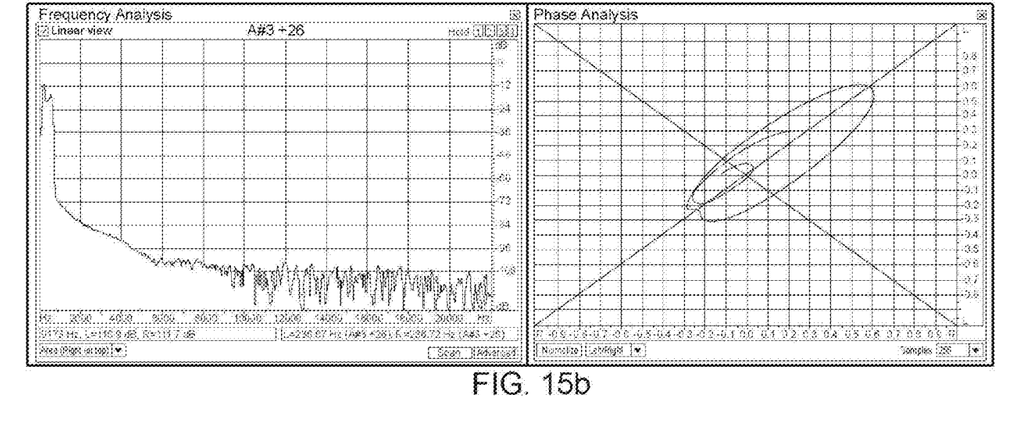

FIG. 15a shows a single sample snapshot from a wave. FIG. 15b shows a single sample snapshot of the same wave, but it has been processed. As can clearly be seen, the harmonic content has been increased in the processed file, while the phase has changed very little. The MAX SOUND process has the ability to drastically change either or both of these as desired by the user.

Figure 16A:
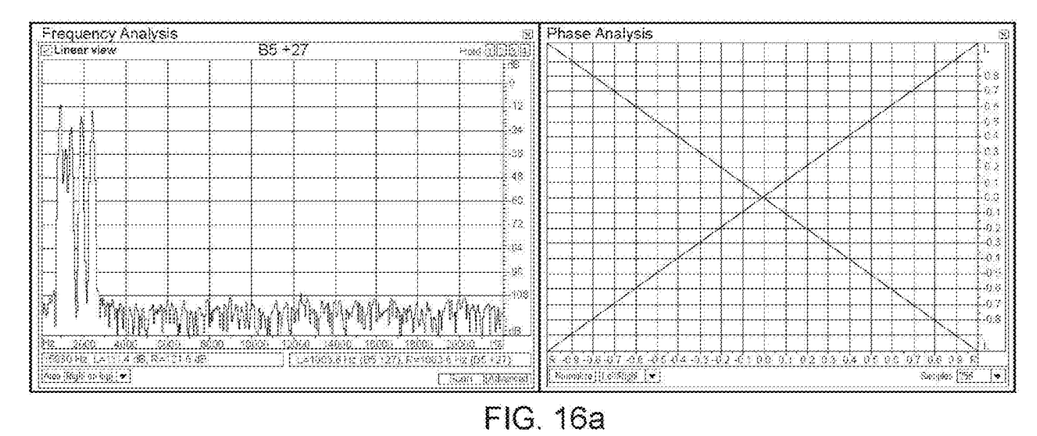
FIGS. 16a and 16b respectively show a single sample snapshot from a 1 kHz Sine wave and a single sample snapshot of the same wave that has been processed according to an exemplary embodiment of the present invention.
Figure 16B:
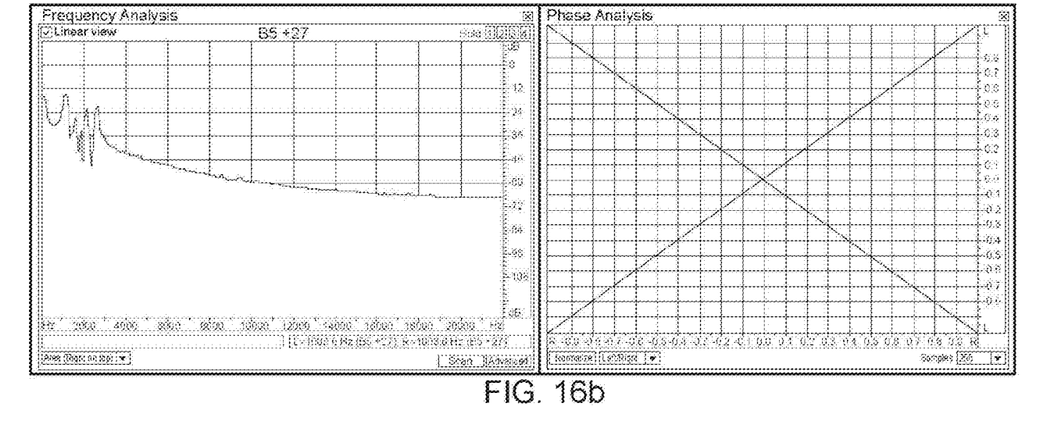

FIG. 16a shows a single sample snapshot from a 1 kHz Sine wave. FIG. 16b shows a single sample snapshot of the same wave, but it has been processed. You can clearly see the harmonic content has been increased in the processed file, while the phase has changed very little. The MAX SOUND process has the ability to drastically change either or both of these as desired by the user.

What is claimed is:

1. An audio enhancement technique comprising:
    an audio source;
    splitting the source audio into at least two branches;
    processing each of the branches by a filter bank;
    summing output signals from each filter bank and creating a summed output signal;
    splitting the summed output signal into two or more segments to create a split summed output signal;
    processing the split summed output signal by at least two audio processing modules;
    summing the audio processed by each of the audio processing modules to create a summed audio processed signal;
    providing the summed audio processed signal to a balance module to select a balance mix of the audio source and the summed audio processed signal to create a balanced mixed audio signal;
    providing the balanced mixed audio signal to a stereo output gain module for gain adjustment to create a gain adjusted stereo signal;
    changing the phase of the gain adjusted stereo signal in an amount between zero and 180 degrees and creating a final output signal
    feeding the final output signal to a playback device selected by user.

2. The audio enhancement technique of claim 1, wherein the number of branches is four and the number of filter banks is four.

3. The audio enhancement technique of claim 2, wherein the number of segments is six.

4. The audio enhancement technique of claim 1 wherein each filter block can be set to operate in different areas as well as different dynamics as the following controls 1) Mute; 2) BPF (digital Band Pass Filter); 2A BP Center—selects the harmonic content and center frequency for this filter; 2B BP (Band Pass) Width—selects the range of frequencies from the center out; 3) Phase—effects the phase of the BPF dynamically; 3A Amount—amount of phase shift will be applied to the audio; 3B Attack—how fast the phase shift starts; 3C Release—the time allowed for the phase shift to complete and restart when a change is detected; 4) LPF (digital Low Pass Filter)—sets the upper limit of frequency content that is allowed to pass on to the next module in this Filter Block; 4A LP (Low Pass) FC (Filter Calculator)—selects the upper frequency limit for this digital filter; 5) Dyn AP—dynamic digital All Pass Filter 1 and Envelope Follower—follows the center frequency set by the FC control dynamically; 5A Attack—how fast the envelope follower reacts to amplitude changes after the release time; 5B Release—how much time before the envelope follower can restart; 5C Amount—the total amount of phase shift (plus and minus) that is dynamically allowed to the audio passing through this section; FC—selects the center frequency for this filter; 6) AP2—digital All Pass Filter 2; 6A FC—selects the center frequency for this filter; 7) Invert—flips the phase to a negative 180 degrees for the output of this entire filter block; 8) FB (Feedback) # Gain—sets the final amplitude (master) for this entire filter block.

5. The audio enhancement technique of claim 1, wherein the audio processing modules relate to one or more of the following modules: 1) Tube module is the amount of digitally simulated tube harmonics that are added into the audio path from the source, where there is a Threshold adjustment control which sets the initial level where the Tube will start processing and the level, or amount is on the main page; 2) The Expander module to dynamically add some user selected harmonic content back into the audio path; 3) Balance—a balance of the original audio that enters this module and the effected audio in the module for a blend of the two; 4) UMPH (bass enhancer) adds more bass content to the audio passed through this module; 5) X-FAD (Cross fader), which routes a small amount of audio from one side to the other; 6) EQ (Equalizer) this module has three settings, No Equalizer, 15 Band, or 31 Band, where the Equalizers are phase coherent and set to be ISO (International Organization for Standardization) compliant centers and the Equalizers both have a range of −50 dB or +25 dB of adjustment per frequency center.

* * * * *